United States Patent [19]

Martin et al.

[11] Patent Number: 5,265,267
[45] Date of Patent: Nov. 23, 1993

[54] INTEGRATED CIRCUIT INCLUDING A SURFACE ACOUSTIC WAVE TRANSFORMER AND A BALANCED MIXER

[75] Inventors: William J. Martin, Fort Lauderdale, Fla.; David Penunuri, Fountain Hills, Ariz.; Jose I. Suarez, Coral Gables, Fla.; Frederick Y. Cho, Scottsdale, Ariz.

[73] Assignee: Motorola, Inc., Schaumburg, Ill.

[21] Appl. No.: 751,845

[22] Filed: Aug. 29, 1991

[51] Int. Cl.$^5$ .................... H04B 1/26; H03H 9/145
[52] U.S. Cl. ......................... 455/326; 455/333; 333/25; 333/193; 310/313 R
[58] Field of Search ............... 333/133, 25, 26, 154, 333/193, 24.1; 310/313 R, 313 A, 313 C, 313 D; 455/325, 326, 327, 328, 333, 323; 358/133

[56] References Cited

U.S. PATENT DOCUMENTS

| | | | |
|---|---|---|---|
| 4,245,330 | 1/1981 | Rebourg | 358/133 |
| 4,473,888 | 9/1924 | Smith | 333/195 |
| 4,491,811 | 1/1985 | Niitsuma et al. | 333/194 |
| 4,584,715 | 4/1986 | Baars et al. | 333/154 |
| 4,622,525 | 11/1986 | Brown | 333/194 |
| 4,625,184 | 11/1986 | Niitsuma et al. | 333/193 |
| 4,639,697 | 1/1987 | Yarranton et al. | 333/193 |
| 4,694,266 | 9/1987 | Wright | 333/193 |
| 4,745,378 | 5/1988 | Niitsuma et al. | 333/154 |
| 4,870,376 | 9/1989 | Wagers | 333/193 |
| 4,950,935 | 8/1990 | Furukawa | 333/154 |
| 4,955,079 | 9/1990 | Connerney et al. | 455/325 |
| 5,006,811 | 4/1991 | Kruger | 455/325 |
| 5,091,708 | 2/1992 | Bezjak | 333/26 |

*Primary Examiner*—Curtis Kuntz
*Assistant Examiner*—Lisa Charouel
*Attorney, Agent, or Firm*—Robert S. Babayi

[57] ABSTRACT

In a radio transceiver (100), an IF stage (110) is formed on a single substrate. A balanced or image rejection mixer (204) having two pairs of inputs and a pair of outputs is integrated on an IC substrate (202). Disposed on the IC substrate are SAW transformers (210, 212 and 214) which provide a desired phase transformation. The SAW transformers comprise piezoelectric layers (228) and metallization layers (230) which are suitably patterned to provide the desired phase transformation and frequency selectivity.

19 Claims, 3 Drawing Sheets

INTEGRATED CIRCUIT INCLUDING A SURFACE ACOUSTIC WAVE TRANSFORMER AND A BALANCED MIXER

TECHNICAL FIELD

This invention relates generally to the field of transceivers and in particular to those transceivers using balanced mixers.

BACKGROUND

In a radio frequency (RF) receiver which uses a balanced mixer or an image rejection mixer to provide the IF signal, it is often required to provide transform phase relation ships of RF inputs, LO inputs, or IF outputs. By using the balanced mixer or the image rejection mixer the effect of even order harmonics of the L.O. and RF input are substantially reduced. Therefore, significant improvement in noise performance as well as intermodulation (IM) distortion of the receiver is realized.

The mixer is generally integrated within an IC substrate using well-known integrated circuit technologies. The IC substrate may be a GaAs, silicon or similar appropriate substrates upon which the balanced mixer is disposed.

A transformation network is required to transform a single input to differential (i.e., 180 degree out of phase) or quadrature (i.e., 90 degree out of phase) outputs which drive the inputs of the mixer. Also needed is another transformation network to transform outputs of the mixer to a single output. Generally, such transformation networks are bidirectional and the same structure may be used to perform both transformation functions.

In view of the constant drive to reduce the size and cost of the receivers, it is desired to integrate the transformation networks and the mixer on the same substrate. In this way, small and easily manufacturable receivers may be obtained without degrading the specification improvements provided by using balanced or image rejection mixers.

Conventionally, coil transformers are widely used as transformation networks in a variety of applications and provide wideband conversion from a single-ended port to balanced ports and vice versa. However, coil transformers are expensive and bulky, in addition to complicating the manufacturing process. Most importantly, they cannot be integrated on the same IC substrate as that of the balanced mixer.

The transformation networks may also be produced using transmission lines or discrete components. However, these components are not integratable. Additionally, at low frequency applications, the size of these components becomes substantially large, which further limits their use in highly miniaturized receivers.

Another method for providing a single input to a balanced output, comprises using differential amplifier pairs. This circuit, though integrated, consumes current, produces distortion, and has an inherent phase and amplitude error in the output.

It is, therefore, desired to provide a transformation network which can be integrated with a balanced mixer circuit on a single substrate to produce a small sized, transceiver.

SUMMARY OF THE INVENTION

Briefly, an integrated circuit, according to the present invention, is formed on an IC substrate. A mixer is integrated within the IC substrate which has at least one input pair and one output pair. At least one SAW transformer is formed on the IC substrate for providing a phase transformation. The SAW transformer is coupled to one of the pair of inputs or the pair of outputs. The SAW transformer is formed by disposing a metallization pattern on the IC substrate and then positioning the piezoelectric layer over the metallization pattern.

In another embodiment, the integrated circuit of the present invention comprises a piezoelectric substrate having an IC die positioned thereon. A metallization layer is disposed on the piezoelectric substrate to form at least one SAW transformer. The IC die has a balanced mixer which couples to the SAW transformer to form the integratable portion of the receiver front end.

DETAILED DESCRIPTION OF THE PREFERRED EMBODIMENT

Figure 1:
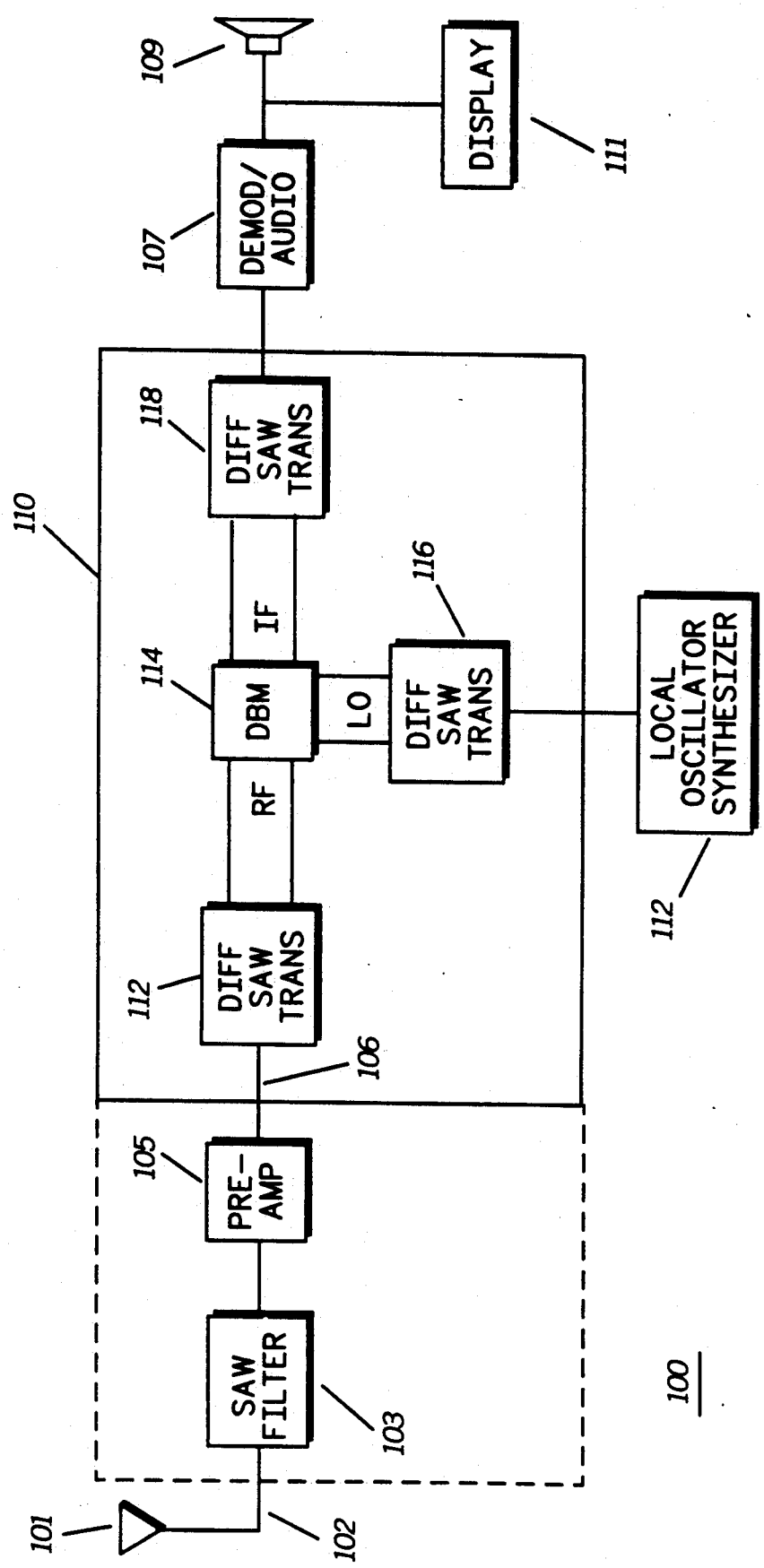
FIG. 1 is a block diagram of a receiver which utilizes an integrated circuit according to the present invention.

Referring to FIG. 1, a block diagram of a receiver 100 which includes the integrated circuit of the present invention is shown. The receiver 100 is a FM receiver which operates in a well-known manner to receive communication signals directed to a communication device such as a small paging unit. Alternatively, the receiver 100 when combined with a transmitter (not shown), provides a transceiver unit for a portable or a mobile two-way radio.

The present invention contemplates utilizing surface acoustic wave (SAW) technology for performing frequency filtering and phase splitting functions of the receiver 100. SAW components use acoustic waves which travel at the speed of sound and are preferred over widely used transmission line components because acoustic waves have a substantially shorter wave length at operating frequency than electromagnetic waves which travel at the speed of light. Therefore, for a given operating frequency, SAW components provide a smaller size compared to transmission lines components. A SAW transformer, as herein referred, comprises the SAW bidirectional three-port network which in one direction may receive a single input to provide a pair of outputs having a specific phase relationship with each other, i.e. 180 degrees or 90 degrees, and in another direction, may receive a pair of inputs (again having a phase relationship with each other) to provide a single output. As is well known, the SAW transformers include elements which are spatially configured to implement a desired phase splitting or phase convergence functions in either of the two directions.

In the receiver 100, a radio frequency (RF) signal 102 carrying a communicated message is received via an antenna 101. The RF signal 102 is applied to a filter 103 which comprises a SAW bandpass filter to provide the initial selectivity for the receiver 100. An amplifier 105 amplifies the output of the filter 103 and couples it to an IF stage 110. The IF stage 110 includes SAW transformers 112, 116 and 118 as well as a mixer 114. The mixer 114 has a pair of RF inputs, a pair of LO inputs, and a pair of IF outputs in which the pairs of inputs and the pair of outputs also have a phase relation ship with each other, i.e. 180 degrees or 90 degrees. The phase relationship of the inputs and outputs is dependent upon the type of mixer used in the IF stage 110. The mixer 114 may comprise a balanced mixer which receives and provides inputs and outputs having 180 degree phase relationship, i.e. differential. Alternatively, the mixer 114 may comprise an image rejection mixer which receives and provides inputs and outputs having 90 degrees, i.e. quadrature, phase relationship. In the foregoing description it is contemplated that the mixer 114 comprises a double balanced mixer (DBM). Moreover, it is also contemplated that the SAW transformers 112, 116 and 118 are structured such that, in addition to providing phase transformation, they also provide frequency filtering and selectivity at the IF stage. Simultaneous phase transformation and filtering functions of the SAW transformers 112, 116 and 118 will further enhance size requirements of the receiver front end and simplifies initial selectivity requirements at the filter 103.

According to the present invention, the IF stage 110 is integrated on a single substrate using both SAW and conventional IC technologies. It may be appreciated that the SAW filter 103 and the amplifier 105 may also be integrated on the same substrate which includes the IF stage 110. As will be described later in detail, the IF stage 110 is a balanced IF stage which includes SAW bidirectional networks which couple to differential input(s) and differential output of the balanced mixer. The SAW transformer 112 receives output of the amplifier 105 at its input and provides outputs which are 180 degrees out of phase from each other. The outputs of the SAW transformer 112 are applied to RF inputs of the well-known DBM 114 which also receives outputs of a SAW transformer 116 at its (local oscillator) LO inputs. The SAW transformer 116 receives a single input from a well-known frequency synthesizer 112 which generates the local oscillator frequency for the receiver 100. The DBM 114 provides a differential IF output which is applied to differential inputs of a SAW transformer 118. The SAW transformer 118 operates in a reverse manner to SAW transformers 112 and 116 in that it receives a differential input and provides a single output. The output of the SAW transformer 118, which comprises the IF signal for the receiver 100, is applied to a well-known demodulator/audio circuitry 107 to recover the communicated message. It may be appreciated by one of ordinary skill in the art that a secondary balanced (or non-balanced) IF stage may exist prior to the demodulator/audio circuitry 107. If the communicated message comprises an audio message it is rendered audible through a speaker 109. If the communicated message comprises a data message it may be displayed via a display device 111.

Figure 2:
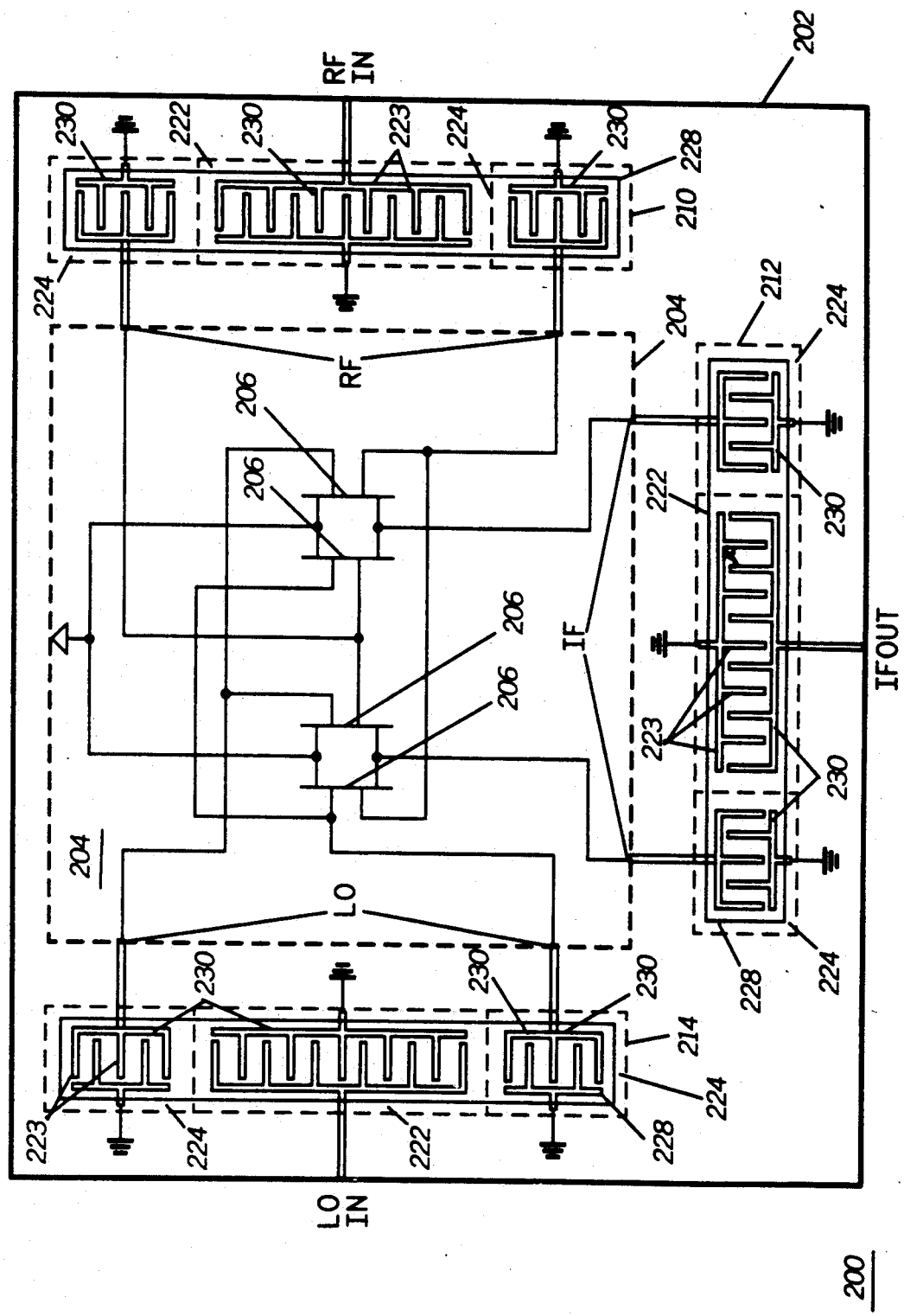
FIG. 2 is top plan view of one embodiment of the integrated circuit according to the present invention.

Referring to FIG. 2, a top plan view of an integrated circuit 200 which comprises the IF stage 110 (shown in FIG. 1) is shown. According to the invention, the integrated circuit 200 includes an IC substrate 202 which has a double balanced mixer 204 (shown in dotted lines) integrated within. The IC substrate 202 may comprise a GaAs substrate or a silicon substrate or any other suitable substrate which allows integration of the double balanced mixer 204 using well-known IC technologies, such as CMOS, GaAs, Bipolar, etc. The DBM 204 includes four dual gate FETs 206 integrated within the IC substrate 202, the terminals of which are coupled to each other, as shown, to provide pairs of inputs RF and LO and one pair of outputs IF. It may be appreciated that other well-known balanced mixer topologies such as a Gilbert cell, may be used to form the DBM 204. Furthermore, it is contemplated that instead of the DBM 204, an image-rejection-mixer be integrated within the IC substrate 202. The image rejection mixer topologies are well known in the art and could be integrated using conventional technologies. Also disposed on the IC substrate 202 are SAW transformers 210, 214, and 212 (shown in dotted lines) which, as described above, are appropriately coupled to the pairs of inputs RF and LO and the pair of outputs IF of the mixer 204.

In the preferred embodiment, each of the SAW transformers 210, 212 and 214 include a center transducer 222 (shown in dotted lines) and two outer transducers 224 (shown in dotted lines) each of which upon electrical excitation, produce an acoustic wave response when an electrical signal is applied to them. The transducers are formed by first disposing metallization layers 230 on the IC substrate 202. Then piezoelectric layers 228 are positioned over the metallization layers 230. The metallization layer is positioned on a major surface (i.e. bottom surface in FIG. 2) of the piezoelectric layers 228. As herein referred to, piezoelectric layers 228 are contemplated to comprise a broad range of piezoelectric materials appropriately disposed on the metallization layer. The piezoelectric layers 228 may, for example, comprise a crystal piezoelectric substrate, such as lithium niobate, quartz, and lithium tantalate, which is suitably cut to be placed over the metallization layers. Alternatively, piezoelectric films may be disposed on a non-piezoelectric substrates to form the piezoelectric layers 228 which in appropriate combination with the metallization layers produce the SAW transformers. It may be appreciated that, although less desirable, the metallization layers 230 may alternatively be disposed on top major surface of the piezoelectric layers 228 to provide both the phase transformation and frequency filtering functionality. Metallization layers 230 are segmented to form grounded and non-grounded layers for the center transducers 222 and the outer transducers 224. The grounded and non-grounded layers are suitably patterned to form interdigitated fingers or electrodes 223 which are interposed between each other to produce a desired response, i.e., phase transformation and frequency filtering.

Operationally, in one direction, the center transducer 222 converts the electrical signal at an input terminal of either or both SAW transformers 210 and 214, i.e. RF IN, or LO IN, into two acoustic waves having equal amplitude and phase. The acoustic waves exit from opposite ends of the center transducer 222 and propagate to the outer transducers 224 through the piezoelectric layer 228. In the embodiment shown in FIG. 2, the transducers 222 and 224 are symmetric, i.e., center-to-center. The distance of the outer transducers 224 from the center transducer 222 is equal. As shown, interdigitated fingers 223 of the outer transducers 224, at opposing ends, have an inverse pattern relationship to each other such that the electrical outputs are phase shifted by 180 degrees. In the other direction, differential outputs of the mixer 204, i.e., IF terminals, are applied to outer transducers 224 of the SAW transformer 212 which transforms them into a single IF OUTPUT.

It may be appreciated that when using SAW transformers, a wide range of phase transformation and frequency filtering are available. Although the combination of two symmetrical outer transducers are shown to produce a 180 degree phase transformation, other combinations, such as a combination of a symmetric and an anti-symmetric outer transducer, may be used to produce a 90 degree phase transformation for an image rejection mixer. Moreover, widely known acoustic couplers, e.g., 3 dB acoustic couplers in combination with transducers, may also be used to produce 180 degrees, 90 degrees or any other phase transformation. In addition, the SAW transducers may be weighted using well known technologies to incorporate the frequency filtering as well as phase transformation functionality into the SAW transformers. For example, if the length of the fingers, i.e. the electrodes, 223 correspond approximately to a sampled version of the Fourier transform (i.e. impulse response) then the SAW transformers exhibit filtering functionality. Another transducer weighting method may include withdrawal weighting, wherein certain fingers or electrodes 223 are grounded so that the local density of grounded electrodes is approximately proportional to the desired impulse response. Yet another method comprises phase weighting, wherein electrode positions are modified slightly with respect to periodic placement of each other so that the resulting phase error weights the impulse response.

An alternative arrangement is to use unidirectional SAW transducers for the outer transducers 224 and 228 to minimize the insertion loss of the transformer 210, 212, and 214 and eliminate spurious acoustic reflections.

Figure 3:
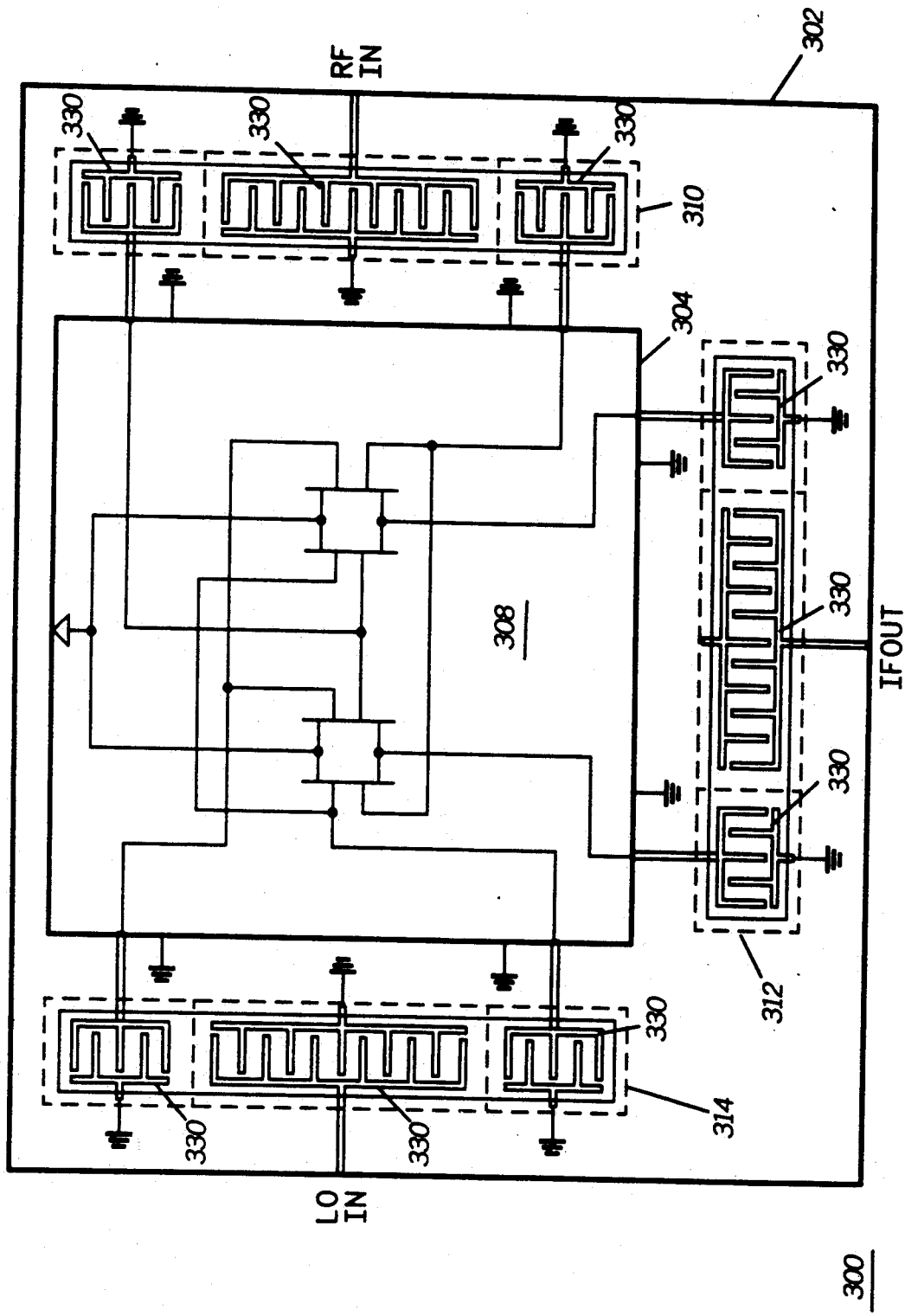
FIG. 3 is top plan view of another embodiment of the integrated circuit according to the present invention.

Referring to FIG. 3, a plan top view of an integrated circuit 300, according to another embodiment of the present invention, is shown. In this embodiment, the substrate upon which the integrated circuit is formed comprises a piezoelectric substrate 302 as opposed to an IC substrate. The piezoelectric substrate 302 has disposed thereon metallization layers 330, suitably patterned to form transformation networks 310, 314 and 312. The transformation networks 310, 312 and 314 operate in the same manner as the transformation networks described in conjunction with FIG. 2. An IC die 304 is positioned on the piezoelectric substrate 302 which has integrated thereon a balanced mixer 308 (or an image rejection mixer). The balanced mixer 308 has differential inputs and outputs which are appropriately coupled to transformation networks 310, 314 and 312 to provide the RF IN, LO IN, and IF OUT terminals for the front end of the receiver 100 (shown in FIG. 1).

The present invention, therefore, allows integration of at least the front end of the receiver by combining both the SAW technology and the conventional IC technology on a single IC chip. The IC chip may comprise the preselector SAW filter (103), the pre-amplifier (105) and the integrated balanced IF stage (110) which comprises the SAW transformers and the mixer produced according to the above description. Integration of the front end of a single IC, according to the principals taught by present invention, provides significant size reduction for the receivers while preserving improvements gained from using a balanced or quadrature IF stage.

What is claimed is:

1. An integrated circuit formed on a single IC substrate, comprising:
   a mixer integrated within said IC substrate having at least one pair of inputs and a pair of outputs; and
   at least one surface acoustic wave transformer disposed on said IC substrate for providing a phase transformation, said acoustic wave transformer being coupled to one of the pair of inputs or the pair of outputs, wherein said surface acoustic wave transformer provides frequency filtering as well as said phase transformation.

2. The circuit of claim 1, wherein said surface acoustic wave transformer comprises a metallization layer and a piezoelectric layer, said metallization layer being suitably patterned on at least one major surface of said piezoelectric layer to provide the desired phase transformation and said frequency filtering.

3. The circuit of claim 2, wherein said metallization layer is disposed on said IC substrate and said piezoelectric layer is positioned over said metallization layer.

4. The circuit of claim 1, wherein said mixer comprises a balanced mixer.

5. The circuit of claim 1, wherein said mixer comprises an image rejection mixer.

6. An integrated circuit formed on a single piezoelectric substrate, comprising:
   a mixer integrated on an IC die positioned on said piezoelectric substrate having at least one pair of inputs and a pair of outputs; and
   at least one surface acoustic wave transformer formed on said piezoelectric substrate, said acoustic wave transformer being coupled to one of the pair of inputs or the pair of outputs.

7. The circuit of claim 6, wherein said surface acoustic wave transformer comprises a metallization layer disposed on said piezoelectric substrate, said metallization layer being suitably patterned to provide a desired phase transformation.

8. The circuit of claim 7, wherein said metallization layer is patterned to provide frequency filtering as well as said phase transformation.

9. The circuit of claim 6, wherein said mixer comprises a balanced mixer.

10. The circuit of claim 6, wherein said mixer comprises an image rejection mixer.

11. An integrated circuit structure comprising;
    an IC substrate;
    a mixer integrated within the IC substrate having at least one pair of inputs and a pair of outputs;
    a metallization layer disposed on said IC substrate; and
    a layer of piezoelectric material positioned over said metallization layer, said metallization layer being suitably patterned to provide a surface acoustic wave transformer for providing a desired phase transformation, said acoustic wave transformer being coupled to one of the pair of inputs or the pair of outputs.

12. The circuit of claim 11, wherein said surface acoustic wave transformer provides frequency filtering as well as said phase transformation.

13. The circuit of claim 11, wherein said mixer comprises a balanced mixer.

14. The circuit of claim 11, wherein said mixer comprises an image rejection mixer.

15. In a radio receiver having an IF stage disposed on a single IC substrate, said IF stage comprising:
    a mixer integrated on said IC substrate having at least one pair of inputs and a pair of outputs; and
    at least one surface acoustic wave transformer disposed on said IC substrate, said acoustic wave transformer being coupled to one of the pair of inputs or the pair of outputs, wherein said surface acoustic wave transformer comprises a metallization layer and a piezoelectric layer, said metallization layer being suitably patterned on at least one major surface of said piezoelectric layer to provide a desired phase transformation.

16. The radio of claim 15, wherein said metallization layer is patterned to provide frequency filtering as well as said phase transformation.

17. The radio of claim 15, wherein said metallization layer is disposed on said IC substrate.

18. The radio of claim 15, wherein said mixer comprises a balanced mixer.

19. The radio of claim 15, wherein said mixer comprises an image rejection mixer.

* * * * *